United States Patent [19]
Bullock et al.

[11] Patent Number: 5,311,119
[45] Date of Patent: May 10, 1994

[54] PROBE CONTACT THROUGH SMALL AMPLITUDE VIBRATION FOR BED OF NAILS TESTING

[75] Inventors: Michael L. Bullock; Ronald K. Kerschner; Stephen J. Cook, all of Loveland, Colo.

[73] Assignee: Hewlett-Packard Company, Palo Alto, Calif.

[21] Appl. No.: 582,263

[22] Filed: Sep. 12, 1990

[51] Int. Cl.$^5$ .................. G01R 31/02; G01R 1/073
[52] U.S. Cl. ........................... 324/158 F; 324/158 P
[58] Field of Search .............. 324/158 P, 158 F, 72.5

[56] References Cited

U.S. PATENT DOCUMENTS 2,918,648  12/1959  Ludman et al. .................. 324/158 P

FOREIGN PATENT DOCUMENTS

| | | |
|---|---|---|
| 79-E8841B | 7/1978 | European Pat. Off. . |
| 0263307 | 3/1988 | European Pat. Off. . |
| 89-262226 | 12/1988 | European Pat. Off. . |
| 0355273 | 2/1990 | European Pat. Off. . |
| A-2344239 | 11/1974 | Fed. Rep. of Germany . |
| 62-098635 | 8/1987 | Japan . |

OTHER PUBLICATIONS

EPO Search Report, Jun. 22, 1992, EP 91 30 7702.0.

Primary Examiner—Ernest F. Karlsen

[57] ABSTRACT

A board fixturing system employed in an automatic in-circuit tester is vibrated at a sub-ultrasonic frequency that is in substantial close proximity to a resonant frequency of at least a major portion of the fixturing system to improve the probability of establishing good electrical conductivity between the probes of the automatic in-circuit tester and predetermined contact locations on the board under test.

19 Claims, 3 Drawing Sheets

PROBE CONTACT THROUGH SMALL AMPLITUDE VIBRATION FOR BED OF NAILS TESTING

FIELD OF THE INVENTION

The present invention relates generally to automatic in-circuit test equipment. More particularly, the present invention relates to a method and apparatus for improving probe contact between each of the probes in the so-called "bed of nails" employed in the board fixturing system of an automatic in-circuit tester and the contact points on the printed circuit board under test.

BACKGROUND OF THE INVENTION

Automatic in-circuit testers for testing components mounted on a printed circuit board ("PCB") are well known. Typically, an in-circuit tester comprises a board fixturing system that employs a plurality of probes arranged in a so-called "bed of nails" for establishing electrical contact between the probes and predetermined contact points on the PCB. Two well known automatic in-circuit testers that employ a bed of nails in the board fixturing system are the HP Model 3065 SMT and HP Model 3070 SMT automatic in-circuit testers manufactured by Hewlett Packard Company, Palo Alto, Calif., the assignee of the present application. The board fixturing system employed in the HP Model 3070 SMT automatic in-circuit tester is disclosed in U.S. Pat. No. 4,818,933, which is incorporated herein by reference.

Contact contamination between the individual probes of the bed of nails and the PCB under test has become more common. Contact contamination may cause a high resistance contact to be established between the probe and the contact point on the PCB, thus resulting in false indications of component failure. The reason for the increase in contact problems is due to changes in PCB soldering technology, as well as use of increased node densities in PCBs.

In the case of changes to PCB soldering technology, many PCB manufacturers have eliminated board wash systems that employ chlorofluorocarbons for environmental reasons. Elimination of the board wash system has resulted in a decrease in PCB cleanliness and, since reliable contact is directly related to board cleanliness, contact problems related to contamination are on the rise.

As mentioned, increased node count is another reason for false indications of failure. In a one hundred node fixture, one false failure in probing per thousand probe contacts occurs, on average, on ten percent of the PCBs tested. For a one thousand node fixture, this problem is increased ten-fold to one hundred percent. This means that, on average, no PCBs will pass the first time, due to false failures as a direct result of increased node count.

Several solutions to the contact contamination problem have been proposed. Increasing the spring force employed to urge the probe into contact with the PCB has proven to decrease probe contact problems. It has been found that probes that exert a force of greater than eight ounces provide the greatest benefit. However, probes that are capable of being exerted against the PCBs at these forces are not available in sizes smaller than those used for 0.100 inch probe spacing. Frequently, the geometry of surface mount PCBs is such that the vias and pads are on less than 0.100 inch centers. For high node count fixtures, the use of high spring force probes may not be possible on vacuum type fixtures due to limitations in the magnitude of atmospheric pressure available to force the PCB down against the probes. Additionally, use of higher probe forces reduces the life of the spring that exerts the force.

Double probing (i.e., placing two probes on each node) has also been found to be effective in decreasing false indications of component failure due to probe contact problems. Assuming that the two probes on each electrical node are statistically independent, the probability of a poor contact is the product of the error probability of each probe. For an individual error rate of one in one thousand, and with two probes on each node, the probability decreases to one in one million. For a one thousand node fixture, this translates to a false probing rate of one in one thousand PCBs tested. Double probing, however, is expensive to implement.

Another known solution is the use of a probe that is designed to twist or rotate as the probe is compressed. This style of probe, frequently known as a twist probe, is presently available only for probes that are mounted 0.100 inch centers. This style of probe is more expensive than conventional style compression probes.

U.S. Pat. No. 3,996,516 describes an apparatus that applies ultrasonic vibrations to a fixturing system, and hence to a test piece, ostensibly for the purpose of improving electrical conductivity at the points of contact between the test piece and measuring pins. However, a test conducted by applicants of the instant application has shown that application of ultrasonic vibrations to a PCB in a board fixturing system did not improve electrical conductivity between the probes and the PCB. Moreover, the apparatus described in the '516 patent suffers from the disadvantage that expensive equipment must be added (i.e., an ultrasonic generator) to the conventional fixturing system. Still further, the apparatus of the '516 patent is not suitable for testing components mounted on a PCB, since the objective of that apparatus is to test for continuity and contact resistances of 2-3 ohms are acceptable. However, in-circuit testing of a PCB's components requires contact resistances of less than 1 ohm.

U.S. Pat. No. 3,453,545 describes a modification to a fixturing system for integrated circuits wherein a wafer is vibrated relative to a plurality of probes, again ostensibly to improve the electrical conductivity therebetween. As in the case of the '516 patent, the apparatus described in the '545 patent suffers from the disadvantage that equipment must be added to a conventional fixturing system to cause the vibrations. Moreover, the apparatus described in the '545 patent is specifically directed to testing the wafers employed in integrated circuits and does not find practical use in in-circuit testing of components mounted on a PCB.

It is therefore desirable to provide a method and apparatus for use in connection with the board fixturing system of an automatic in-circuit tester that reduces problems associated with contact contamination but yet is simple, reliable and inexpensive to implement. The present invention achieves these goals.

SUMMARY OF THE INVENTION

The present invention is for particular use in an automatic in-circuit tester with fixturing means for interfacing a printed circuit board ("PCB") having electronic components mounted thereon to a plurality of test probes for applying electrical signals to and receiving electrical signals from the PCB. An apparatus according to the present invention comprises first means for biasing the PCB into contact with the probes at predetermined locations on the PCB. A second means vibrates the fixturing means relative to the probes at a sub-ultrasonic frequency that is substantially equal to a resonant frequency of at least a portion of the fixturing means after contact has been established between the predetermined locations and the probes. In one embodiment of the invention, the first means comprises the same indexing means that is employed in the board fixturing system described in U.S. Pat. No. 4,818,933, and the drive means (motor) is excited so as to vibrate the indexing means relative to the PCB. In another embodiment of the invention, the first means comprises a vacuum source, and an external source of oscillatory energy is employed to vibrate the fixture.

DETAILED DESCRIPTION OF THE DRAWINGS

Figure 1:
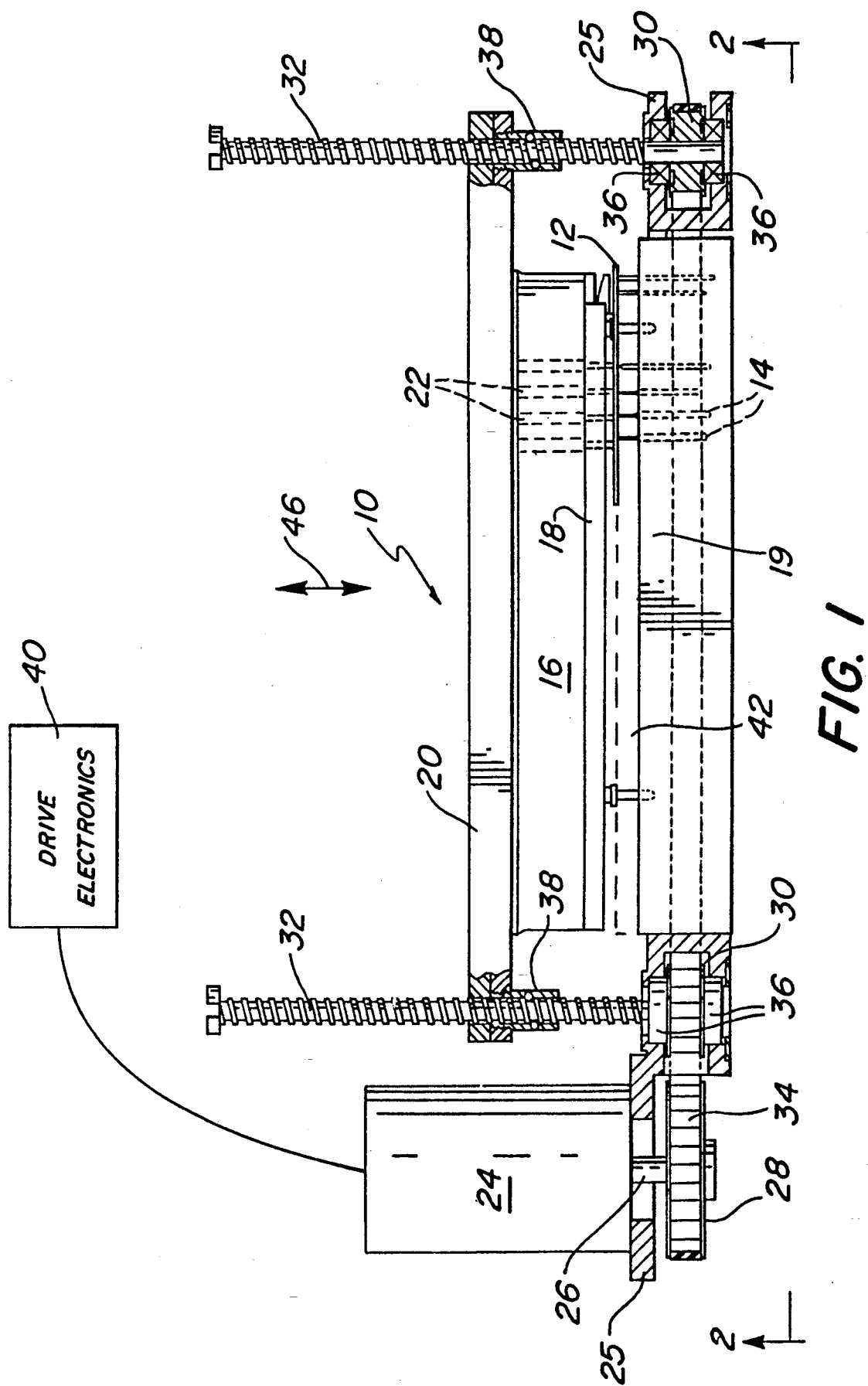
FIG. 1 is a side plan view, with partial cut away, illustrating a board fixturing system for use in accordance with one embodiment of the invention.

Referring to the drawings, wherein like numerals represent like elements, there is illustrated in FIG. 1 a board fixturing system 10 for use in connection with an automatic in-circuit tester, such as the aforementioned HP Model 3070 SMT in-circuit tester. The details of the board fixturing system 10 are fully disclosed in aforementioned U.S. Pat. No. 4,818,933, and reference is made thereto for a detailed description of its structure and operation. The board fixturing system 10 illustrated in FIG. 1 is commercially available from Hewlett Packard Company, Palo Alto, Calif. as Hewlett Packard part No. 44990A.

The board fixturing system 10 is for establishing contact between predetermined locations (i.e., nodes, such as vias or pads) on the PCB under test 12 and a plurality of spring loaded probes 14. The PCB 12 is urged into contact with the probes 14 by indexable means 16 which comprises a top probe plate 18 affixed to an upper plate 20. As shown, the indexable means 16 carries a plurality of rigid push pins 22 for making contact with the upper surface of the PCB 12 when the indexable means is indexed downwardly, thereby urging the underside of PCB 12 into contact with probes 14. The probes 14 are carried by a bottom probe plate 19.

Figure 2:
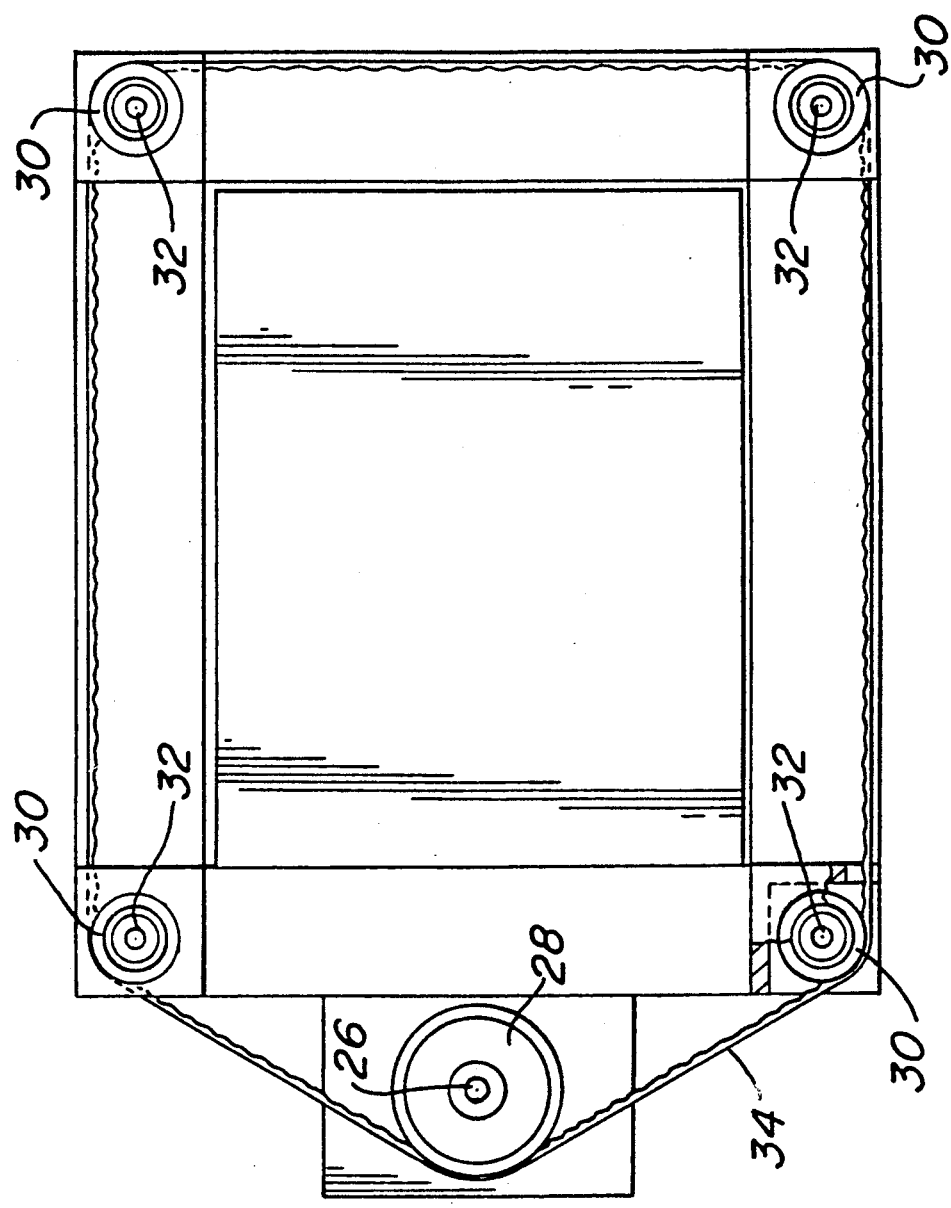
FIG. 2 is a bottom plan view taken along line 2—2 of FIG. 1.

A stepping motor 24 rests on a casting 25 associated with the board fixturing system 10. The casting 25 extends across the width of the fixture 10 and forms a chassis or frame for the fixture. A shaft 26 of the motor 24 is mechanically coupled to a drive pulley 28. The pulley 28 drives a belt 34, which in turn drives a plurality of pulleys 30 mechanically coupled to a plurality of ball screws 32. See FIG. 2. Each of the pulleys 30 is sandwiched between a pair of bearings pressed into the casting 25, as shown in FIG. 1.

Associated with each ball screw 32, and fixed to the upper plate 20 is a ball nut 38. As shown, ball nut 38 contains one or more bearings that threadedly engage the ball screw 32. It will therefore be appreciated that rotation of the motor shaft 26 will result in rotation of the ball screw 32, which in turn will result in vertical movement of the indexable means 16 so as to engage or release the PCB 12 between the push pins 22 and the probes 14.

The stepping motor 24 is controlled by drive electronics 40. The drive electronics 40 may be of a type that supplies control pulses to the stepping motor 24 wherein the shaft 26 of stepping motor 24 is rotated by a predetermined, incremental amount upon receipt of each pulse from drive electronics 40. In a preferred practice of the invention, once the indexable means 16 has been vertically indexed so as to establish contact between each of the probes 14 and the PCB 12, the drive electronics 40 excites the stepping motor 24 in a manner so as to cause the indexable means 16 to reciprocate or oscillate ("vibration") in the direction shown by arrow 46. Thus, the vibration is in the direction of orientation of the probes 14. It will be appreciated that the lower probe plate 19, and hence the probes 14, remain stationary relative to the indexable means 16. The effect, therefore, is to repeatedly urge the PCB 12 against the probes 14.

It has been discovered that vibration of the indexable means 16 at a frequency substantially close to the resonant frequency of the board fixturing system provides excellent results in establishing good electrical conductivity between each probe 14 and the predetermined contact locations on the PCB 12. In the case of the aforementioned commercially available HP board fixture, it has been found that this frequency is sub-ultrasonic and is in the range of about 120 Hz to about 200 Hz. Preferably, the peak to peak amplitude of the vibration of the indexable means 16 is about 0.002 inch (i.e., 0.001 inch above and below center).

It will be appreciated that the system thus described does not require the addition to or modification of any of the parts of the board fixturing system 10, since the stepping motor 24 and all of the other drive elements are part of the conventional system. The only modification is in the drive electronics, which may be carried out by a simple software change in the case of a microcomputer based implementation.

Figure 3:
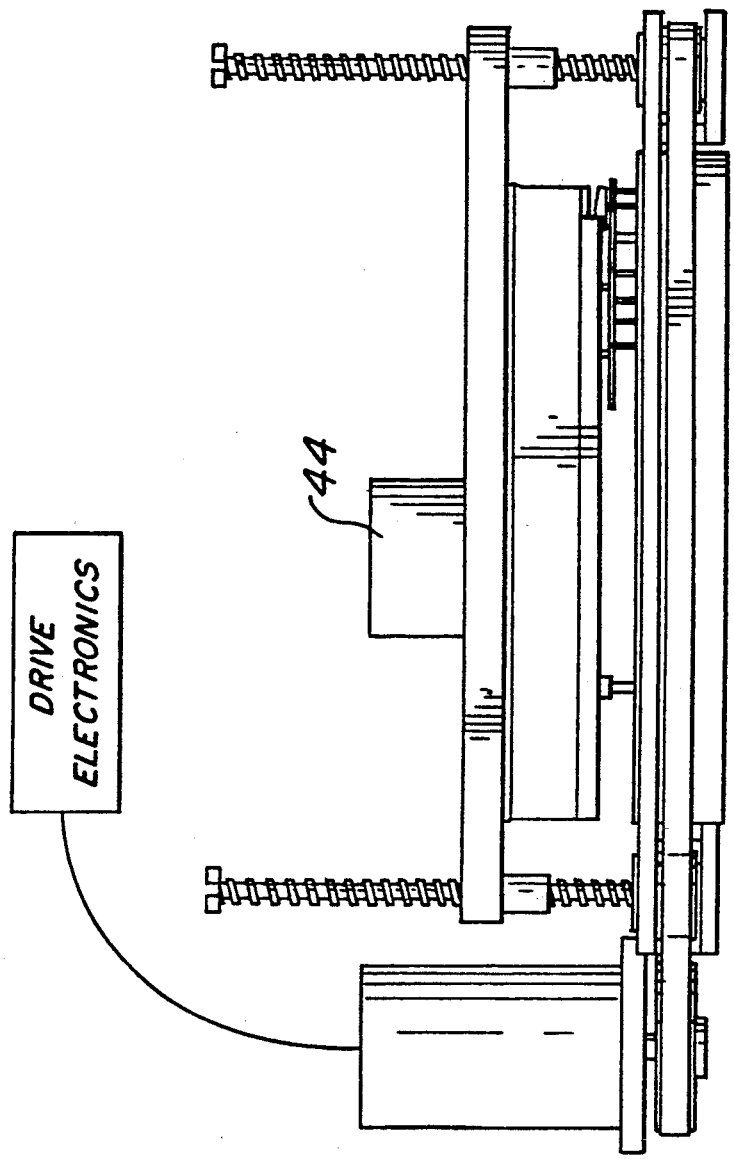
FIG. 3 is a side plan view of a board fixturing system for use in connection with another embodiment of the invention.

If desired, an external source of oscillatory energy, such as a pneumatic vibration source 44 (see FIG. 3) may be employed to provided the vibrations. The same frequency and amplitude considerations as discussed above are applicable if an external source 44 is employed.

The present invention also has application to board fixturing systems of the type employing a vacuum to urge the PCB 12 into contact with the probes 14. Vacuum type board fixturing systems are well known, and may include a gasket 42 (shown as a dotted line in FIG. 1) instead of the indexable means 16 and associated drive means, to urge the board 12 into contact with the probes 14. The gasket 42 is preferably provided with a small plenum and a plurality of apertures so that, when a vacuum is applied to the plenum, the board 12 is urged into contact with the probes 14. In such application, an external source of vibratory energy, such as source 44 of FIG. 3, may be employed to impart the vibration to the PCB 12. Again, the same frequency and amplitude considerations as discussed above are applicable.

In all embodiments, it is preferable that the vibration be applied for a predetermined length of time (such as four seconds) after contact has been established between the probes 14 and the predetermined locations on the PCB. The result of applying the vibration is that the probability a poor electrical contact between the predetermined locations on the PCB and the probes 14 is decreased after application of the vibration, since the probes substantially wear through any contamination on the PCB at the predetermined locations.

A test was conducted in which nickel PCBs were subjected to five days of humidity to contaminate them, then probed both conventionally and in accordance with the invention. Results show that, with 100 mil probes, the probability of all probes establishing an electrical contact to the PCB of less than 0.1 ohm increased to over 95 percent when probed in accordance with the invention, as compared to about 35 percent when probed conventionally. For 50 mil probes, the results show the probabilities to be over 90 percent when probed in accordance With the invention and about 20 percent when probed conventionally.

A method of operating an in-circuit tester of the type herein described according to the invention comprises the steps of:

a. establishing contact between the probes 14 and the predetermined locations of the PCB 12;

b. vibrating the means for urging the PCB 12 into contact with the probes 14 at a frequency substantially that of the resonant frequency of at least a portion of the board fixture for a predetermined period of time after step (a) has been performed; and, c. conducting in-circuit tests after step (b) has been performed.

The present invention may be embodied in other specific forms without departing from the spirit or essential attributes thereof and, accordingly, reference should be made to the appended claims, rather than to the foregoing specification, as indicating the scope of the invention.

We claim:

1. In an automatic in-circuit tester with fixturing means for interfacing a printed circuit board (PCB) having electronic components mounted thereon to a plurality of test probes for applying electrical signals to and receiving electrical signals from the PCB, apparatus comprising:

a) first means for biasing the PCB into contact with the probes at predetermined locations on the PCB; and, b) second means for vibrating the fixturing means relative to the probes at a sub-ultrasonic frequency after contact has been established between said predetermined locations and the probes; wherein the subultrasonic frequency is in substantial close proximity to a resonant frequency of at least a portion of the fixturing means.

2. Apparatus according to claim 1 wherein the first means comprises a vacuum source.

3. Apparatus according to claim 1 wherein the first means comprises an indexing means, including a motor, and wherein the second means is coupled to the first means.

4. Apparatus according to claim 1, 2 or 3 wherein the second means comprises an external source of oscillatory energy.

5. Apparatus according to claim 3 wherein the second means comprises control means coupled to the motor for exciting the motor at said sub-ultrasonic frequency, the motor vibrating the indexing means at said sub-ultrasonic frequency.

6. Apparatus according to claim 1 wherein said sub-ultrasonic frequency is in the range of about 120 Hz to about 200 Hz.

7. Apparatus according to claim 1 wherein peak to peak amplitude of said vibration is about 0.002 inch.

8. In a board fixturing system for interfacing a printed circuit board (PCB) having electronic components mounted thereon to a plurality of test probes for applying electrical signals to and receiving electrical signals from the PCB, apparatus comprising:

a) indexing means, including a motor, for biasing the PCB into contact with the probes to establish contact between the probes and predetermined locations of the PCB; and, b) control means operatively coupled to the motor for exciting the motor at a predetermined frequency for a predetermined length of time after contact has been established between the probes and said predetermined locations and thereby vibrating the indexing means relative to the probes at said predetermined frequency for said predetermined length of time;

the probability of a poor electrical contact between said predetermined locations and the probes being decreased after said vibration;

wherein the predetermined frequency is in substantial close proximity to a resonant frequency of at least a portion of the fixturing system.

9. Apparatus according to claim 8 wherein all of the probes have a substantially identical orientation and the vibration is in the direction of the orientation.

10. Apparatus according to claim 8 wherein the frequency is in the range of about 120 Hz to about 200 Hz.

11. Apparatus according to claim 8 wherein peak to peak amplitude of the vibration is about 0.002 inch.

12. Apparatus according to claim 8 wherein the probes are stationary and the indexing means is vibrated.

13. Apparatus according to claim 8 wherein the motor is a stepping motor.

14. Apparatus according to claim 8 wherein the indexing means comprises a plurality of ball screws mechanically coupled to rotate with rotations of a shaft of the motor and a plurality of ball nuts fixed to a first plate and threadedly engaging the ball screws, the first plate being indexed with rotation of the ball screw, the first plate carrying a plurality of push pins for contacting the PCB and urging the PCB against the probes, at least the first plate and push pins vibrating relative to the probes.

15. Apparatus according to claim 14 wherein the probes are disposed in a second plate that is fixed against movement with respect to the first plate.

16. Apparatus according to claim 15 wherein the probes are spring loaded within the second plate for urging against the predetermined locations of the PCB after contact has been established.

17. In an automatic in-circuit tester of a type having a board fixturing system for interfacing a printed circuit board (PCB) having electronic components mounted thereon to a plurality of test probes for applying electrical signals to and receiving electrical signals from the PCB, apparatus comprising:

a) an indexable plate carrying a plurality of push pins;

b) a stepping motor having a shaft mechanically coupled to rotate a plurality of ball screws, there being an equal plurality of ball nuts fixed to the first plate and threadedly engaging the ball screws, rotation of the shaft in a first direction indexing the first plate relative to the PCB, the push pins urging the PCB into contact with the probes at predetermined locations;

c) control means operatively coupled to the motor for exciting the motor at a sub-ultrasonic frequency that is in substantial close proximity to a resonant frequency of at least a portion of the fixturing system for a predetermined length of time after contact has been established between the probes and said predetermined locations and thereby oscillating the first plate and push pins relative to the probes at said sub-ultrasonic frequency for said predetermined length of time;

the probes substantially wearing through any contamination on the PCB at said predetermined locations as a result of said oscillation, the probability of a poor electrical contact between said predetermined locations and the probes thereby being decreased after said oscillation.

18. Apparatus according to claim 17 wherein the sub-ultrasonic frequency is in the range of about 120 Hz to about 200 Hz.

19. Apparatus according to claim 17 wherein peak to peak amplitude of said oscillation is about 0.002 inch.

* * * * *